(12) United States Patent
Soer et al.

(10) Patent No.: US 9,041,912 B2
(45) Date of Patent: *May 26, 2015

(54) SPECTRAL PURITY FILTERS FOR USE IN A LITHOGRAPHIC APPARATUS

(75) Inventors: Wouter Anthon Soer, Nijmegen (NL); Vadim Yevgenyevich Banine, Helmond (NL); Maarten Marinus Johannes Wilhelmus Van Herpen, Heesch (NL); Andrey Mikhailovich Yakunin, Eindhoven (NL); Martin Jacobus Johan Jak, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 307 days.

This patent is subject to a terminal disclaimer.

(21) Appl. No.: 13/617,705

(22) Filed: Sep. 14, 2012

(65) Prior Publication Data

US 2013/0010363 A1    Jan. 10, 2013

Related U.S. Application Data

(63) Continuation of application No. 12/500,198, filed on Jul. 9, 2009, now Pat. No. 8,390,788.

(60) Provisional application No. 61/079,975, filed on Jul. 11, 2008, provisional application No. 61/136,150, filed on Aug. 14, 2008, provisional application No. 61/136,983, filed on Oct. 20, 2008.

(51) Int. Cl.
*G03B 27/72* (2006.01)
*G03F 7/20* (2006.01)
*G21K 1/10* (2006.01)

(52) U.S. Cl.
CPC ............ *G03F 7/702* (2013.01); *G03F 7/70191* (2013.01); *G03F 7/70575* (2013.01); *G21K 1/10* (2013.01)

(58) Field of Classification Search
CPC .................. G03F 7/70191; G03F 7/70575
USPC ............. 355/71, 67; 359/359, 587, 360, 361; 430/5; 250/504 R
See application file for complete search history.

(56) References Cited

U.S. PATENT DOCUMENTS 6,014,251 A * 1/2000 Rosenberg et al. ........... 359/350
6,522,465 B1   2/2003 Goldstein (Continued)

FOREIGN PATENT DOCUMENTS

EP    1 515 188 A1    3/2005
EP    1 708 031 A2    10/2006

(Continued)

OTHER PUBLICATIONS

International Search Report directed to related International Application No. PCT/EP2009/004981, mailed Dec. 17, 2009, from the European Patent Office; 4 pages.

(Continued)

*Primary Examiner* — Peter B Kim
*Assistant Examiner* — Michelle Iacoletti
(74) *Attorney, Agent, or Firm* — Sterne, Kessler, Goldstein & Fox P.L.L.C

(57) ABSTRACT

According to an aspect of the present invention, a spectral purity filter includes an aperture, the aperture being arranged to diffract a first wavelength of radiation and to allow at least a portion of a second wavelength of radiation to be transmitted through the aperture, the second wavelength of radiation being shorter than the first wavelength of radiation, wherein the aperture has a diameter greater than 20 μm.

13 Claims, 8 Drawing Sheets

(56) References Cited

U.S. PATENT DOCUMENTS

| | | | |
|---|---|---|---|
| 6,737,662 | B2 | 5/2004 | Mulder et al. |
| 6,906,787 | B2 | 6/2005 | Van De Kerhof et al. |
| 7,154,666 | B2 | 12/2006 | Wedowski |
| 7,372,623 | B2 | 5/2008 | Banine et al. |
| 7,453,645 | B2 * | 11/2008 | Klunder et al. ............... 359/634 |
| 8,139,200 | B2 | 3/2012 | Van Herpen et al. |
| 2002/0186741 | A1 | 12/2002 | Kleinschmidt et al. |
| 2004/0114120 | A1 | 6/2004 | Van De Kerhof et al. |
| 2006/0146413 | A1 | 7/2006 | Klunder et al. |
| 2006/0221440 | A1 | 10/2006 | Banine et al. |
| 2006/0245058 | A1 | 11/2006 | Van Herpen et al. |
| 2007/0170379 | A1 | 7/2007 | Watson et al. |
| 2008/0239268 | A1 | 10/2008 | Mulder et al. |
| 2010/0020304 | A1 | 1/2010 | Soer et al. |
| 2011/0143269 | A1 | 6/2011 | Yakunin et al. |
| 2011/0211185 | A1 | 9/2011 | Jak et al. |

FOREIGN PATENT DOCUMENTS

| | | |
|---|---|---|
| JP | 05-217857 A | 8/1993 |
| JP | 08-236425 A | 9/1996 |
| JP | 2000-352612 A | 12/2000 |
| JP | 2004-186691 A | 7/2004 |
| JP | 2004-524524 A | 8/2004 |
| JP | 2004-317693 A | 11/2004 |
| JP | 2006-191090 A | 7/2006 |
| JP | 2006-279036 A | 10/2006 |
| JP | 2006-310793 A | 11/2006 |
| WO | WO 2009/061192 A1 | 5/2009 |

OTHER PUBLICATIONS

International Preliminary Report on Patentability and the Written Opinion of the International Searching Authority directed to related International Application No. PCT/EP2009/004981, mailed Jan. 11, 2011, from the International Bureau of WIPO; 7 pages.

English-Language Translation of Notice of Reasons for Rejection directed to related Japanese Patent Application No. 2009-162313, mailed Jun. 27, 2011, from the Japanese Patent Office; 3 pages.

Non-Final Rejection mailed Jan. 17, 2012 for U.S. Appl. No. 12/500,198, filed Jul. 9, 2009; 7 pages.

Final Rejection mailed Jul. 6, 2012 for U.S. Appl. No. 12/500,198, filed Jul. 9, 2009; 6 pages.

Notice of Allowance mailed Sep. 18, 2012 for U.S. Appl. No. 12/500,198, filed Jul. 9, 2009; 7 pages.

Notice of Allowance mailed Nov. 9, 2012 for U.S. Appl. No. 12/500,198, filed Jul. 9, 2009; 9 pages.

International Search Report directed to related International Patent Application No. PCT/EP2009/005488, mailed Dec. 23, 2009.

European Office Action dated Jan. 8, 2013 directed to related European Patent Application No. 09 777 515.9.

Singapore Written Opinion and Search Report mailed Apr. 19, 2013 in corresponding Singapore Patent Application No. 201100299-5.

Bibishkin, M.S., et al., "Multilayer Zr/Si filters for EUV lithography and for radiation source metrology," Proc. of SPIE, Micro- and Nanoelectronics 2007, vol. 7025, Oct. 1, 2007; pp. 702502-1 to 702502-10.

Johnson, T.A., et al., "Zirconium and niobium transmission data at wavelengths from 11-16 nm and 200-1200 nm," Proc. of SPIE, Optical Constants of Materials for UV to X-Ray Wavelengths, vol. 5538, 2004; pp. 119-124.

Kaye & Laby, "Optical pyrometry," The Tables of Physical and Chemical Constants, Section 2.3.4, 16th Edition, 1995, National Physical Laboratory; 3 pages.

Louis, E., et al., "Multilayer optics with spectral purity layers for the EUV wavelength range," Proc. of SPIE, Emerging Lithographic Technologies X, vol. 6151, Jan. 1, 2006; pp. 615139-1 to 615139-5.

Powell, F.R., et al., "Filter windows for EUV lithography," Proc. of SPIE, Emerging Lithographic Technologies V, vol. 4343, 2001; pp. 585-589.

Ravindra, N. M., et al., "Modeling and Simulation of Emissivity of Silicon-Related Materials and Structures," Journal of Electronic Materials, vol. 32, No. 10, 2003; pp. 1052-1058.

Truong, V.V., et al., "Optical properties of bulk niobium from 6.6 to 23 eV," Journal of the Optical Society of America, vol. 68, No. 8, Aug. 1978; pp. 1017-1018.

Non-Final Rejection mailed Nov. 15, 2012 for U.S. Appl. No. 13/058,783, filed Feb. 11, 2011; 9 pages.

Final Rejection mailed Feb. 12, 2013 for U.S. Appl. No. 13/058,783, filed Feb. 11, 2011; 9 pages.

Non-Final Rejection mailed Aug. 20, 2013 for U.S. Appl. No. 13/058,783, filed Feb. 11, 2011; 10 pages.

Final Rejection mailed Oct. 29, 2013 for U.S. Appl. No. 13/058,783, filed Feb. 11, 2011; 10 pages.

Non-Final Rejection mailed Jun. 18, 2014 for U.S. Appl. No. 13/059,057, filed Apr. 28, 2011; 11 pages.

Final Rejection mailed Oct. 6, 2014 for U.S. Appl. No. 13/059,057, filed Apr. 28, 2011; 9 pages.

Non-Final Rejection mailed Feb. 25, 2015 for U.S. Appl. No. 13/059,057, filed Apr. 28, 2011; 9 pages.

* cited by examiner

SPECTRAL PURITY FILTERS FOR USE IN A LITHOGRAPHIC APPARATUS

CROSS-REFERENCE TO RELATED APPLICATIONS

This application is a continuation of U.S. patent application Ser. No. 12/500,198, filed Jul. 9, 2009 (that issued as U.S. Pat. No. 8,390,788 on Mar. 5, 2013), which claims the benefit under 35 U.S.C. §119(e) of U.S. Provisional Application No. 61/079,975, filed Jul. 11, 2008; U.S. Provisional Patent Application No. 61/136,150, filed Aug. 14, 2008; and U.S. Provisional Patent Application No. 61/136,983, filed Oct. 20, 2008, which are incorporated by reference herein in their entireties.

BACKGROUND

1. Field

Embodiments of the present invention relate to spectral purity filters (SPFs), and in particular, although not restricted to, spectral purity filters for use in a lithographic apparatus.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to be able to project ever smaller structures onto substrates, it has been proposed to use extreme ultraviolet radiation (EUV) having a wavelength within the range of 5-20 nm, for example within the range of 13-14 nm. It has further been proposed that radiation with a wavelength of less than 10 nm could be used, for example 6.7 nm or 6.8 nm. In the context of lithography, wavelengths of less than 10 nm are sometimes referred to as 'beyond EUV' or as 'soft x-rays'.

Extreme ultraviolet radiation and beyond EUV radiation may be produced using, for example, a plasma. The plasma may be created for example by directing a laser at particles of a suitable material (e.g., tin), or by directing a laser at a stream of a suitable gas or vapor, such as Xe gas or Li vapor. The resulting plasma emits extreme ultraviolet radiation (or beyond EUV radiation), which is collected using a collector such as a mirrored grazing incidence collector, which receives the extreme ultraviolet radiation and focuses the radiation into a beam.

Practical EUV Sources, such those which generate EUV radiation using a plasma, do not only emit desired 'in-band' EUV radiation, but also undesirable 'out-of-band' radiation. This out-of-band radiation is most notably in the deep ultraviolet (DUV) radiation range (100-400 nm). Moreover, in the case of some EUV sources, for example laser produced plasma EUV sources, the radiation from the laser, usually at 10.6 μm, presents a significant amount of out-of-band radiation.

In a lithographic apparatus, spectral purity is required for several reasons. One reason is that resist is sensitive to out-of-band wavelengths of radiation, and thus the image quality of patterns applied to the resist may be deteriorated if the resist is exposed to such out-of-band radiation. Furthermore, out-of-band infrared radiation, for example the 10.6 μm radiation in some laser produced plasma sources, leads to unwanted and unnecessary heating of the patterning device, substrate and optics within the lithographic apparatus. Such heating may lead to damage of these elements, degradation in their lifetime, and/or defects or distortions in patterns projected onto and applied to a resist-coated substrate.

In order to overcome these problems, several different transmissive spectral purity filters have been proposed which substantially prevent the transmission of infrared radiation, whilst simultaneously allowing the transmission of EUV radiation. Some of these proposed spectral purity filters include a thin metal layer or foil which is substantially opaque to, for example, infrared radiation, while at the same time being substantially transparent to EUV radiation. These and other spectral purity filters may also be provided with one or more apertures. The size and spacing of the apertures may be chosen such that infrared radiation is diffracted by the apertures, while EUV radiation is transmitted through the apertures. A spectral purity filter provided with apertures may have a higher EUV transmittance than a spectral purity filter which is not provided with apertures. This is because EUV radiation will be able to pass through an aperture more easily than it would through a given thickness of metal foil or the like.

One problem associated with spectral purity filters provided with apertures is that the apertures are so small that the manufacturing options that are available to create the apertures are limited and/or expensive. Furthermore, the small diameter of the apertures reduces the mechanical robustness of the spectral purity filter.

In a lithographic apparatus it is desirable to minimize the losses in intensity of radiation which is being used to apply a pattern to a resist coated substrate. One reason for this is that, ideally, as much radiation as possible should be available for applying a pattern to a substrate, for instance to reduce the exposure time and increase throughput. At the same time, it is desirable to minimize the amount of undesirable (e.g., out-of-band) radiation that is passing through the lithographic apparatus and which is incident upon the substrate.

It is therefore an object of embodiments of the present invention to provide an improved or alternative spectral purity filter. For example, it is an object of embodiments of the present invention to provide a spectral purity filter provided with at least one aperture, and which is easier to manufacture, and/or is more mechanically robust than known or proposed spectral purity filters. It is also an object of embodiments of the present invention to provide alternative spectral purity filter arrangements. It is a further object of embodiments of the present invention to provide a spectral purity filter with improved suppression of undesirable (e.g., out-of-band) radiation, such as infrared radiation.

BRIEF SUMMARY OF THE INVENTION

According to a first aspect of the present invention there is provided a spectral purity filter, including: an aperture, the aperture being arranged to diffract a first wavelength of radiation and to allow at least a portion of a second wavelength of radiation to be transmitted through the aperture, the second wavelength of radiation being shorter than the first wavelength of radiation; wherein the aperture has a diameter greater than 20 µm.

According to a second aspect of the present invention there is provided a spectral purity filter, including: an aperture, the aperture being arranged to diffract a first wavelength of radiation and to allow at least a portion of a second wavelength of radiation to be transmitted through the aperture, the second wavelength of radiation being shorter than the first wavelength of radiation; wherein a sidewall of the aperture is provided with a coating.

The coating may be arranged to absorb at least a portion of the first wavelength of radiation. The coating may be arranged to inhibit reflection of at least a portion of the first wavelength of radiation. The coating may be arranged to promote reflection of at least a portion of the second wavelength. The coating may be arranged to inhibit degradation or environmental damage to the aperture.

The aperture may have a diameter greater than 20 µm.

According to the first or second aspects of the present invention, the aperture may have a diameter greater than 20 µm and less than or equal to 200 µm.

According to the first or second aspects of the present invention, the spectral purity filter may be provided with a plurality of apertures. The spectral purity filter may be provided with a periodic array of apertures. The spectral purity filter may be provided with an aperiodic array of apertures.

According to a third aspect of the present invention there is provided a spectral purity filter, including: a first aperture having a first diameter, the first aperture being arranged to diffract a first wavelength of radiation and to allow at least a portion of a second wavelength of radiation to be transmitted through the aperture, the second wavelength of radiation being shorter than the first wavelength of radiation; wherein the spectral purity filter is also provided with: a second aperture having a second diameter, the second diameter being smaller than the first diameter, the second diameter being small enough to prevent diffraction of the first wavelength of radiation, while allowing transmission of at least a portion of the second wavelength of radiation.

The first aperture has a diameter greater than 20 µm. The first aperture may have a diameter greater than 20 µm and less than or equal to 200 µm. The second aperture may have a diameter which is less than or equal to half of the wavelength of the first wavelength of radiation.

The spectral purity filter may be provided with a plurality of first apertures. The spectral purity filter may be provided with a periodic array of first apertures. The spectral purity filter may be provided with an aperiodic array of first apertures.

The spectral purity filter may be provided with a plurality of second apertures. The spectral purity filter may be provided with a periodic array of second apertures. The spectral purity filter may be provided with an aperiodic array of second apertures.

According to the first, second or third aspects of the present invention, material forming the spectral purity filter may be substantially transparent to the transmission of the second wavelength of radiation. Material forming the spectral purity filter may be substantially opaque to the transmission of the first wavelength of radiation. Material forming the spectral purity filter may be arranged to absorb or reflect the first wavelength of radiation.

According to the third aspect of the present invention, material forming the spectral purity filter may be substantially transparent to the transmission of the first wavelength of radiation. The spectral purity filter may be arranged such that a phase difference is introduced between radiation of the first wavelength that is arranged to pass through the material and radiation of the first wavelength that is arranged to pass through (and be diffracted by) the first aperture. The spectral purity filter may be configured such that destructive interference of a zero diffraction order of the first wavelength of radiation takes place between radiation of the first wavelength that is arranged to pass through (and be diffracted by) the material and radiation of the first wavelength that is arranged to pass through and be diffracted by the first aperture. The spectral purity filter may have a thickness which causes the destructive interference.

According to a fourth aspect of the present invention there is provided a spectral purity arrangement, including: a spectral purity filter provided with one or more apertures, the one or more apertures being arranged to transmit and diffract a first wavelength of radiation and to allow at least a portion of a second wavelength of radiation to be transmitted through the one or more apertures, the second wavelength of radiation being shorter than the first wavelength of radiation; material forming the spectral purity filter being substantially transparent to the transmission of the first wavelength of radiation, the spectral purity filter being configured such that destructive interference of a zero diffraction order of the first wavelength of radiation takes place between radiation of the first wavelength that is arranged to pass through the material and radiation of the first wavelength that is arranged to pass through the one or more apertures; the spectral purity arrangement further including: a structure provided with a further aperture, the spectral purity filter and the structure being arranged relative to one another such that at least a portion of the second wavelength of radiation is able to pass through the spectral purity filter and the further aperture that is provided in the structure, and wherein a spacing or diameter of the one or more apertures of the spectral purity filter is configured to ensure that less than 50% of radiation of the first wavelength of radiation is able to pass through the further aperture that is provided in the structure.

The spectral purity filter may be configured such that a phase difference is introduced between radiation of the first wavelength that is arranged to pass through the material and radiation of the first wavelength that is arranged to pass through the one or more apertures, in order to cause the destructive interference. The spectral purity filter may have a thickness which causes the destructive interference.

The spacing or diameter of the one or more apertures of the spectral purity filter may be configured to ensure that a first diffraction order of the first wavelength of radiation is incident upon the structure and not transmitted through the further aperture of the structure.

The structure may be a plate.

The structure may be at least a part of a radiation source, an illumination system, or a projection system. The structure may be at least a part of radiation source, an illumination system, or a projection system of a lithographic apparatus. The structure may be at least a part of a housing of the radiation source, at least a part of a housing of the illumination system, or at least a part of a housing of the projection system.

The spectral purity filter may be provided with a plurality of apertures. The spectral purity filter may be provided with a periodic array of apertures or an aperiodic array of apertures.

The spacing or diameter of the one or more apertures of the spectral purity filter may be configured to ensure that less than 10% of radiation of the first wavelength of radiation is able to pass through the further aperture that is provided in the structure, or such that less than 5% of radiation of the first wavelength of radiation is able to pass through the further aperture that is provided in the structure.

According to the first, second, third or fourth aspects of the present invention, the first wavelength of radiation may have a wavelength that is in the infrared part of the electromagnetic spectrum. The first wavelength of radiation may have a wavelength that is approximately 10.6 µm. The second wavelength of radiation may have a wavelength that is in, or is shorter than, the EUV part of the electromagnetic spectrum.

According to a fifth aspect of the present invention, there is provided a lithographic apparatus provided with a spectral purity filter or spectral purity arrangement according to the first, second, third or fourth aspects of the present invention.

The lithographic apparatus may further include: an illumination system configured to condition a radiation beam, the radiation beam including the first wavelength of radiation, the second wavelength of radiation, or the first wavelength of radiation and the second wavelength of radiation; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate.

According to a sixth aspect of the present invention, there is provided a radiation source provided with a spectral purity filter or spectral purity arrangement according to the first, second, third or fourth aspects of the present invention.

According to a seventh aspect of the present invention, there is provided a method of affecting the spectral purity of a radiation beam, the radiation beam including a first wavelength of radiation and a second wavelength of radiation, the method including: directing the radiation beam at a spectral purity filter or spectral purity arrangement according to the first, second, third or fourth aspects of the present invention.

According to an eighth aspect of the present invention, there is provided a lithographic method, including: directing a radiation beam including a first wavelength of radiation and a second wavelength of radiation at a spectral purity filter or spectral purity arrangement according to the first, second, third or fourth aspects of the present invention; and using radiation transmitted by the spectral purity filter or spectral purity arrangement to apply a pattern to a substrate coated with radiation sensitive material.

In the description of embodiments of the present invention, the terms 'substantially transparent' and 'substantially opaque' have been used. 'Substantially transparent' may be defined as a material or object having a transmission of greater than 50% of the radiation in question, and in particular a transmission of between 80% and 100%. 'Substantially opaque' may be defined as a material or object having a transmission of less than 50% of the radiation in question, and in particular a transmission of between 0% and 20%.

BRIEF DESCRIPTION OF THE DRAWINGS/FIGURES

Embodiments of the invention will now be described, by way of example only, with reference to the accompanying schematic drawings in which corresponding reference symbols indicate corresponding parts.

FIG. 1 schematically depicts a lithographic apparatus according to an embodiment of the invention.

FIG. 2 is a more detailed but schematic depiction of the lithographic apparatus shown in FIG. 1.

FIG. 3 schematically depicts a spectral purity filter in accordance with a first embodiment of the present invention.

FIG. 4 schematically depicts a spectral purity filter in accordance with another embodiment of the present invention.

Figure 3:
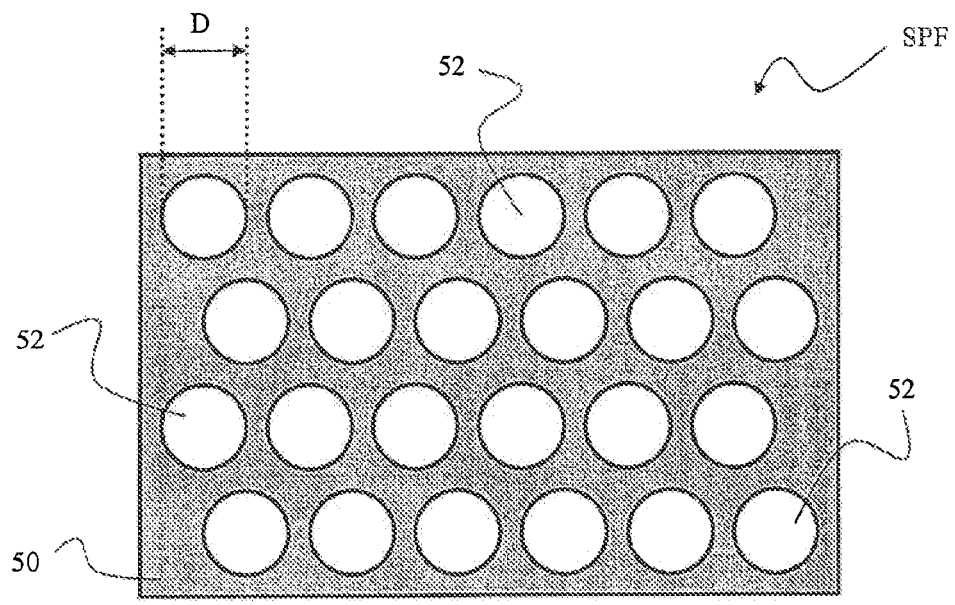
Figure 4:
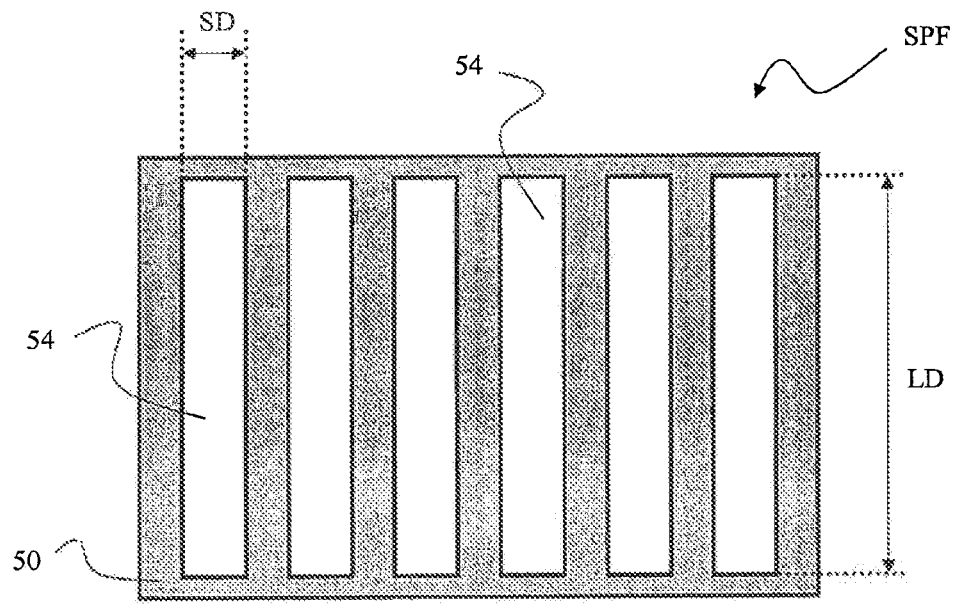
Figure 7:
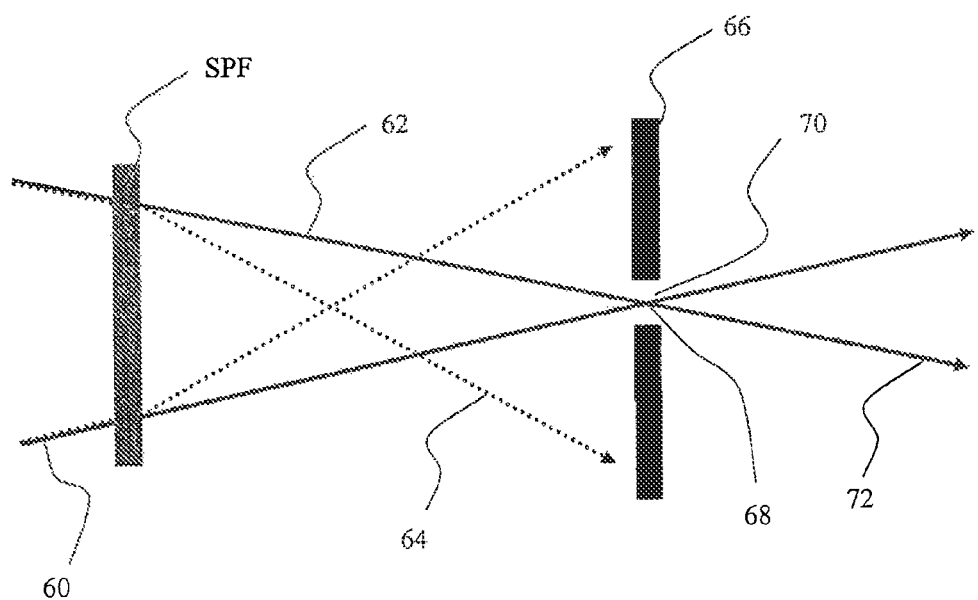

FIG. 7 schematically depicts yet further operating principles associated with the embodiments shown in FIGS. 3 and 4.

Figure 8:
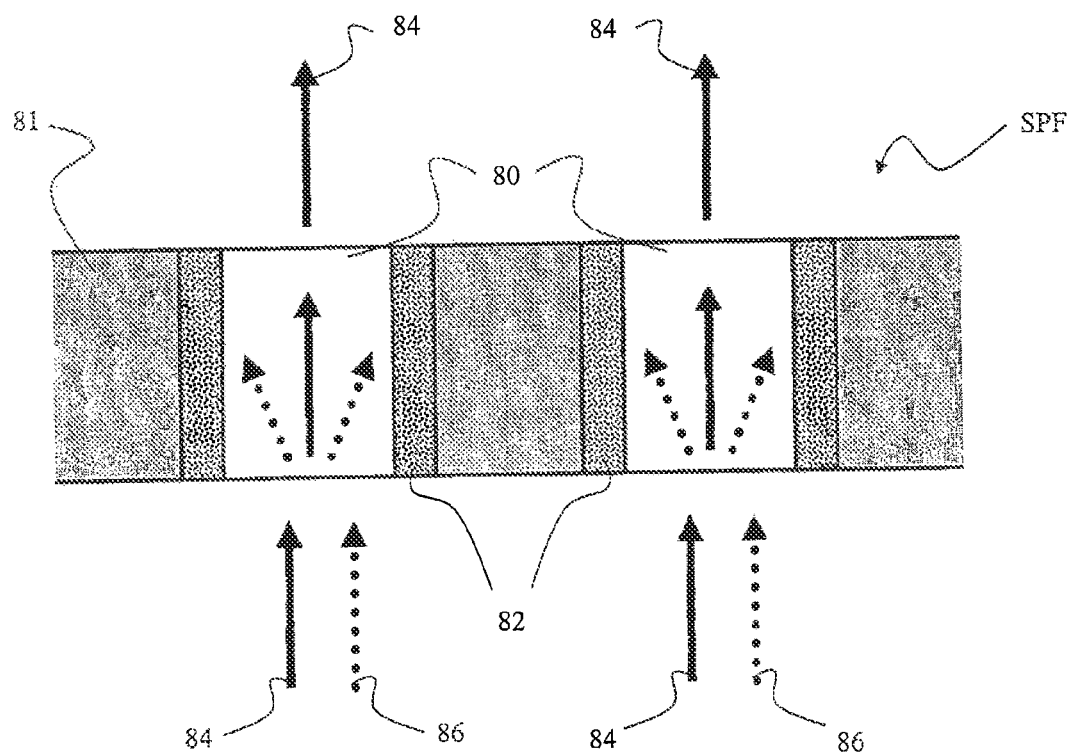

FIG. 8 schematically depicts the coating of side walls of apertures of a spectral purity filter in accordance with another embodiment of the present invention.

Figure 9:
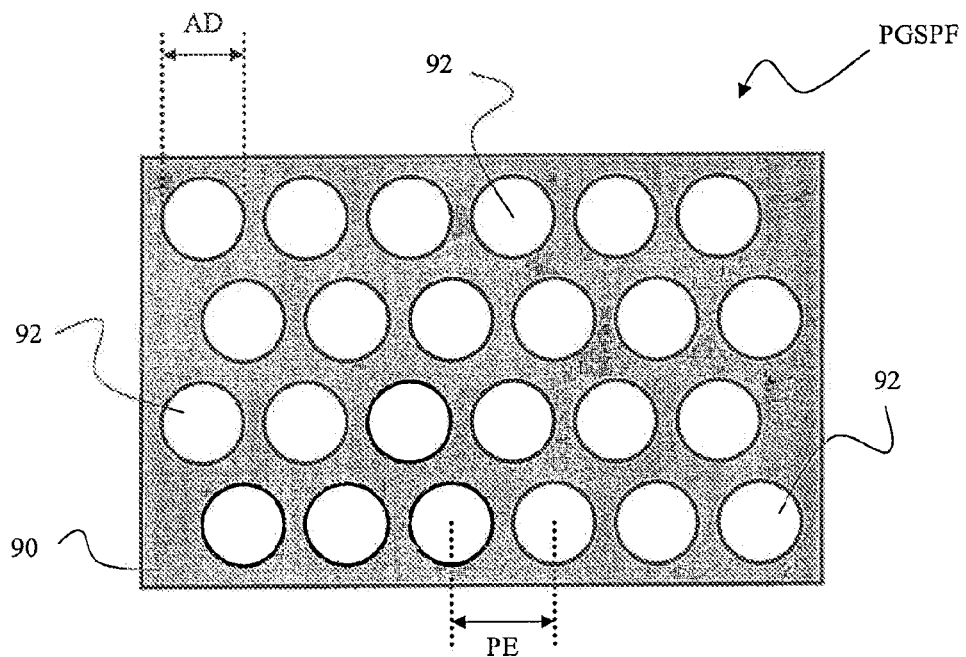

FIG. 9 schematically depicts a phase grating spectral purity filter in accordance with another embodiment of the present invention.

Figure 10:
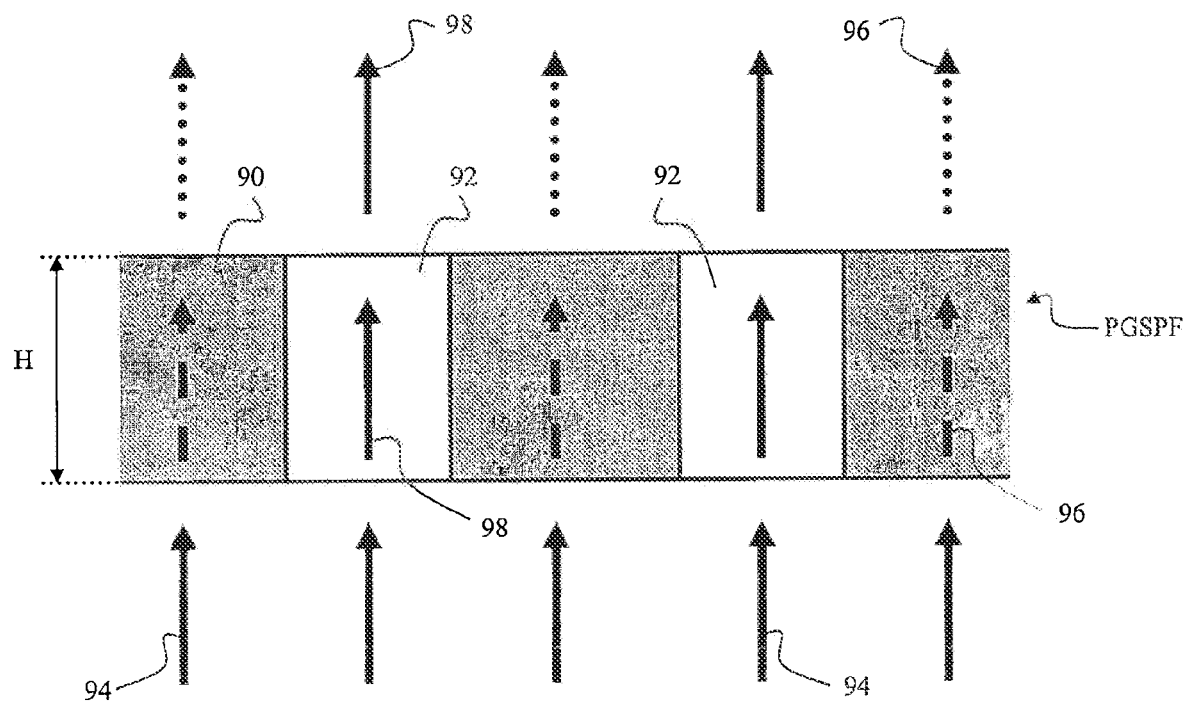

FIG. 10 schematically depicts operating principles associated with the phase grating spectral purity filter shown in FIG. 9.

Figure 11:
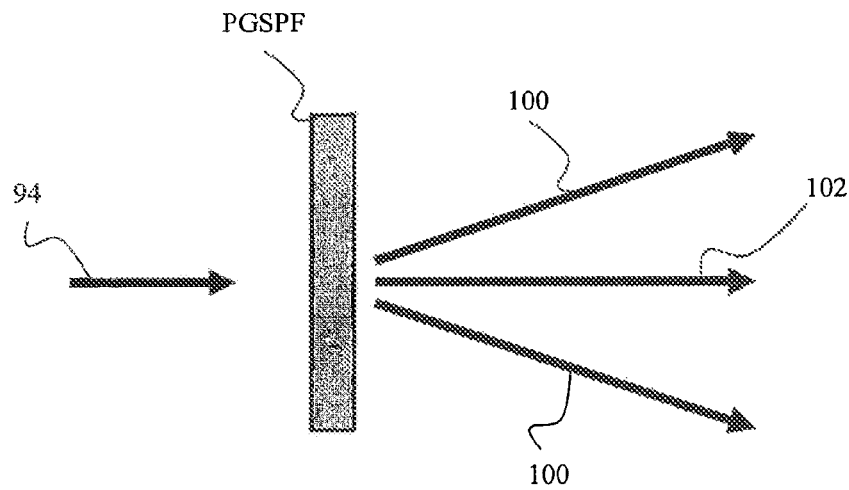

FIG. 11 schematically depicts further operating principles associated with the phase grating spectral purity filter shown in FIG. 9.

Figure 12:
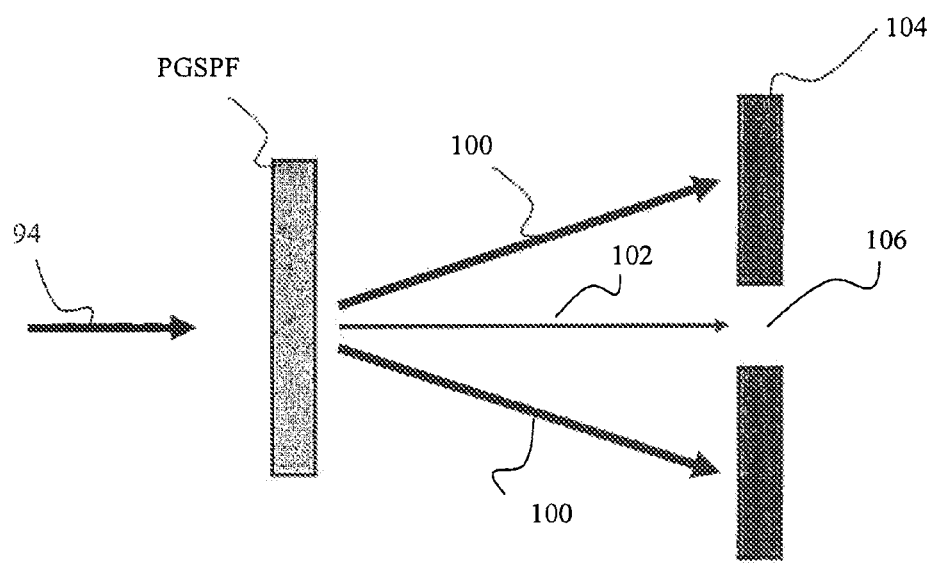

FIG. 12 schematically depicts yet further operating principles associated with the phase grating spectral purity filter shown in FIG. 9.

Figure 13:
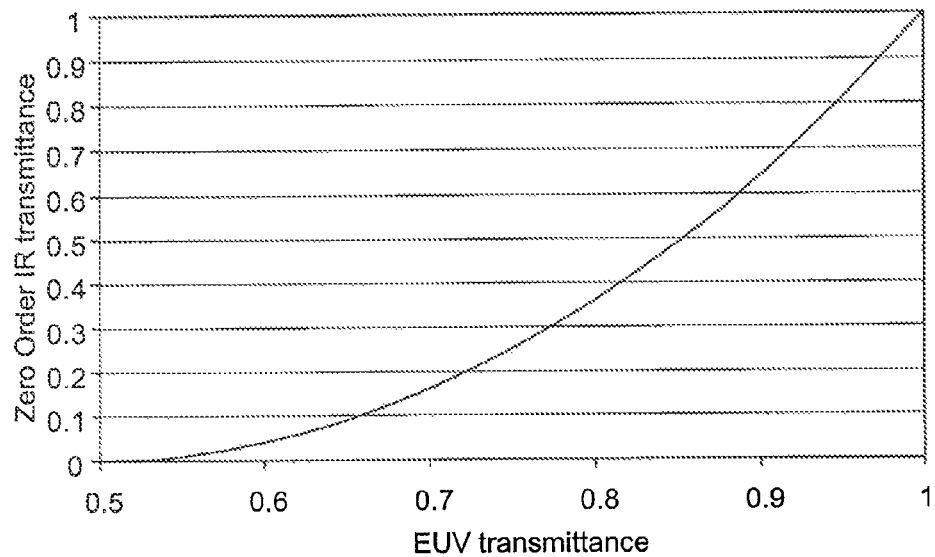

FIG. 13 is a graph schematically depicting further operating principles associated with the embodiments shown in and described with reference to FIG. 9.

Figure 14:
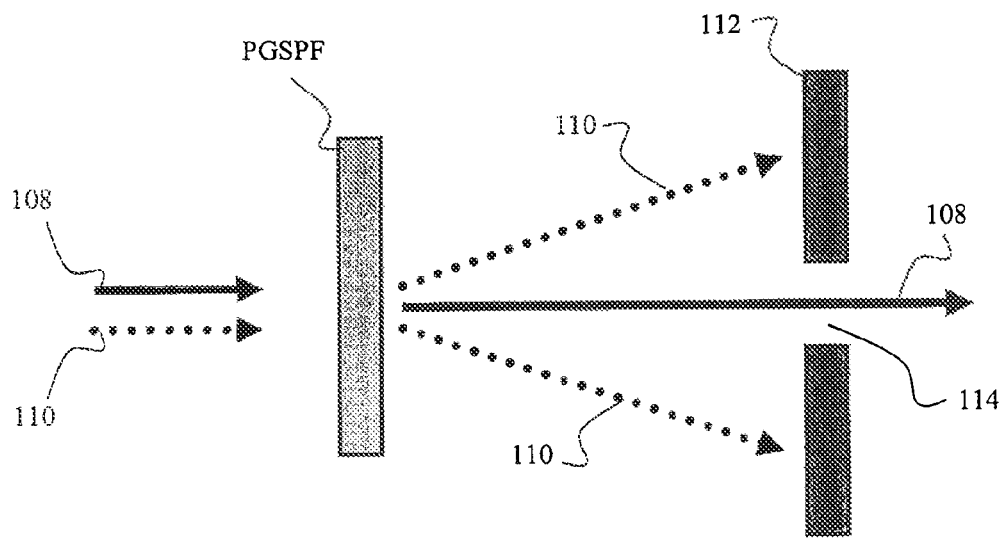

FIG. 14 schematically depicts and summarizes operating principles associated with the embodiments of FIGS. 9 to 13.

Figure 15:
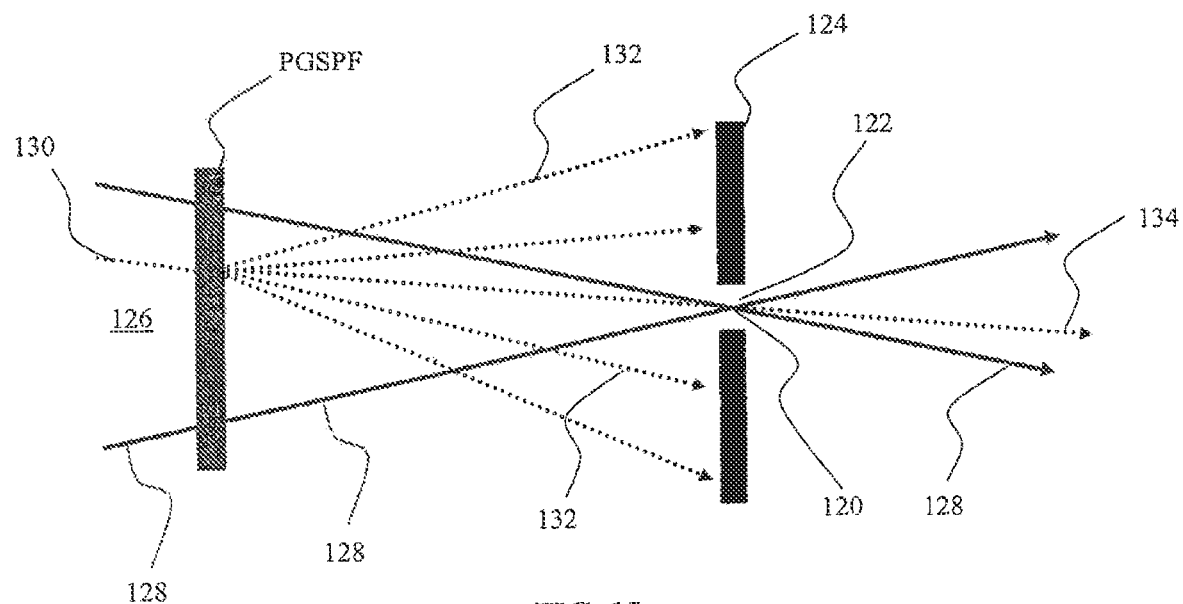

FIG. 15 schematically depicts an application of the embodiments shown in and described with reference to FIGS. 9 to 14.

Figure 16:
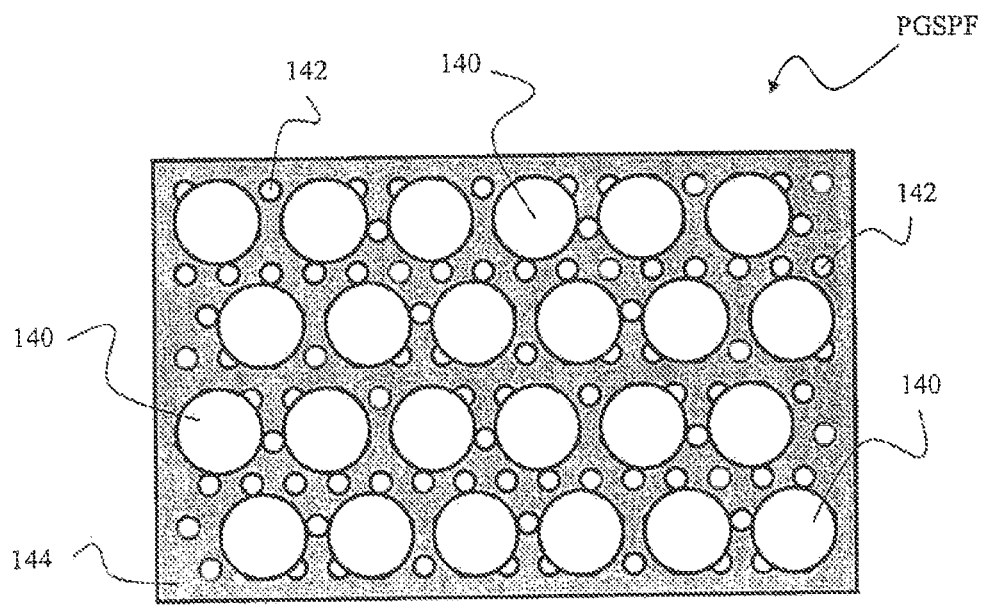

FIG. 16 schematically depicts a spectral purity filter in accordance with yet another embodiment of the present invention.

DETAILED DESCRIPTION

Figure 1:
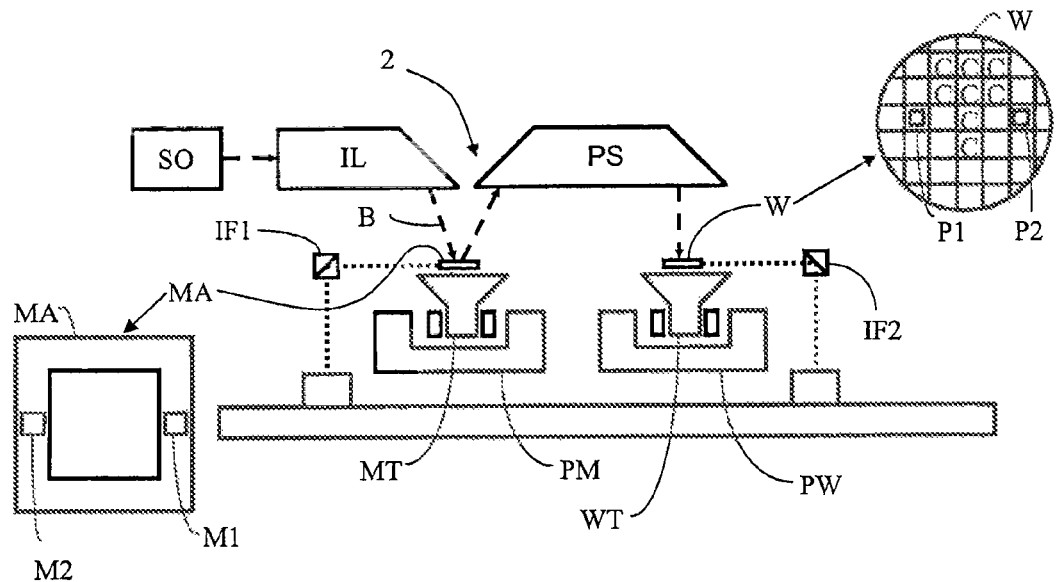

FIG. 1 schematically depicts a lithographic apparatus 2 according to one embodiment of the invention. The apparatus 2 includes: an illumination system (illuminator) IL configured to condition a radiation beam B (e.g., EUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by a patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus 2, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and typically in an EUV radiation (or beyond EUV) lithographic apparatus would be reflective. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. Usually, in an EUV (or beyond EUV) radiation lithographic apparatus the optical elements will be reflective. However, other types of optical element may be used. The optical elements may be in a vacuum. Any use of the term "projection lens" herein may be considered as synonymous with the more general term "projection system".

As here depicted, the apparatus 2 is of a reflective type (e.g., employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator IL may be used to condition the radiation beam B to have a desired uniformity and intensity distribution in its cross-section.

The radiation beam B is incident on the patterning device (e.g., mask MA), which is held on the support structure (e.g., mask table MT), and is patterned by the patterning device. Having been reflected by the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus 2 could be used in at least one of the following modes.

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
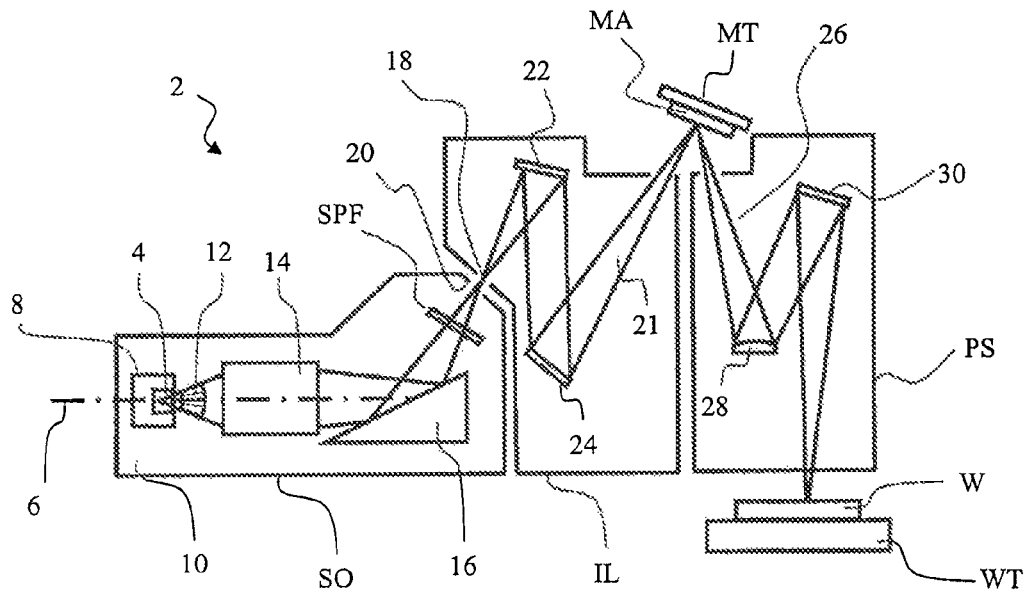

FIG. 2 shows the lithographic apparatus 2 in more detail, including a radiation source SO, an illuminator IL (sometimes referred to as an illumination system), and the projection system PS. The radiation source SO includes a radiation emitter 4 which may include a discharge plasma. EUV radiation may be produced by a gas or vapor, such as Xe gas or Li vapor in which very hot plasma is created to emit radiation in the EUV radiation range of the electromagnetic spectrum. The very hot plasma is created by causing partially ionized plasma of an electrical discharge to collapse onto an optical axis 6. Partial pressures of e.g., 10 Pa of Xe or Li vapor or any other suitable gas or vapor may be required for efficient generation of the radiation. In some embodiments, tin may be used. FIG. 2 illustrates a discharge produced plasma (DPP) radiation source SO. It will be appreciated that other sources may be used, such as for example a laser produced plasma (LPP) radiation source.

The radiation emitted by radiation emitter 4 is passed from a source chamber 8 into a collector chamber 10. The collector chamber 10 includes a contamination trap 12 and grazing incidence collector 14 (shown schematically as a rectangle). Radiation allowed to pass through the collector 14 is reflected off a grating spectral filter 16 to be focused in a virtual source point 18 at an aperture 20 in the collector chamber 10. Before passing through the aperture 20, the radiation passes through a spectral purity filter SPF. The spectral purity filter SPF is described in more detail below. From collector chamber 10, a beam of radiation 21 is reflected in the illuminator IL via first and second reflectors 22, 24 onto a reticle or mask MA positioned on reticle or mask table MT. A patterned beam of radiation 26 is formed which is imaged in projection system PS via first and second reflective elements 28, 30 onto a substrate W held on a substrate table WT.

It will be appreciated that more or fewer elements than shown in FIG. 2 may generally be present in the source SO, illumination system IL, and projection system PS. For instance, in some embodiments the illumination system IL and/or projection system PS may contain a greater or lesser number of reflective elements or reflectors.

It is known to use a spectral purity filter in a lithographic apparatus to filter out undesirable (e.g., out-of-band) wavelength components of a radiation beam. For instance, it is known to provide a spectral purity filter including one or more apertures. The diameter of each aperture is chosen such that it diffracts one or more undesirable wavelengths of radiation, while allowing one or more different wavelengths of desirable radiation to pass through the apertures. For instance, the undesirable radiation may include infrared radiation, whereas the desirable radiation may include EUV or beyond EUV radiation.

Proposed spectral purity filters which include apertures (sometimes referred to as aperture spectral purity filters) are provided with apertures having a diameter of up to 20 μm. The small diameter of these apertures limits the manufacturing options which are available to form these apertures, and also reduces the mechanical robustness of the spectral purity filter. In accordance with an embodiment of the present invention, a spectral purity filter is provided with one or more apertures, the apertures having a diameter greater than 20 μm. Because the apertures are greater than 20 μm in diameter, they may be more easily provided in a spectral purity filter than apertures having a diameter lower than 20 μm. For instance, apertures having a diameter of greater than 20 μm may be provided using well established laser drilling apparatus and techniques. An aperture having a diameter larger than 20 μm is suitable for suppressing, for example, the 10.6 μm out-of-band infrared radiation mentioned above. Increasingly larger diameter apertures may also suppress infrared radiation having a higher wavelength. The apertures may have, for example, a diameter which is greater than 20 μm and less than or equal to 200 μm in order to, for example, cause diffraction of and therefore suppress infrared radiation.

The use of apertures having a diameter greater than 20 μm has many advantages associated with it when compared with proposed spectral purity filters with apertures having a diameter less than 20 μm. For instance, laser cutting (sometimes referred to as laser drilling) is very suitable for providing one or more (e.g., an array) of holes in metal plates and plates formed from other materials, in order to form an aperture spectral purity filter. The minimum diameter of currently available laser micro-machining systems (e.g., laser drilling apparatus) is about 20 μm, meaning that such micro-machining systems are particularly suitable for use in conjunction with embodiments of the present invention. In contrast, such micro-machining systems are not suited for use in proposed aperture spectral purity filters, where the apertures have a diameter lower than 20 μm. Another advantage is the fact that the mechanical robustness of the spectral purity filter increases when apertures in the filter are greater than 20 μm in diameter. This is because the wall thickness between adjacent apertures for a given fill ratio (i.e., the ratio of aperture space to plate or non-aperture space) is greater when the apertures are greater than 20 μm in diameter than it is when the apertures are less than 20 μm in diameter. This is especially advantageous when the spectral purity filter must withstand large stress concentrations, for example to prevent crack propagation. Another advantage is that in a spectral purity filter with apertures having a diameter greater than 20 μm, EUV optical losses on the sidewalls of the aperture are smaller than with apertures of a smaller diameter (for the same given thickness of spectral purity filter). Such losses may occur due to small misalignment of the spectral purity filter or the apertures of the filter, or due to thickness variation in the spectral purity filter. Losses are greater when a radiation beam incident on the spectral purity filter, for example a beam of EUV radiation, is divergent. A yet further advantage of using apertures having a diameter greater than 20 μm is that it makes it easier to apply a coating to sidewalls of the apertures. For example, it may be desirable to apply an infrared absorbing and/or anti-reflection coating to the sidewalls in order to maximize the suppression of the infrared radiation, or to provide a coating to promote EUV reflection and therefore transmission through the aperture.

The above advantages will now be described in more detail with reference to specific embodiments of the present invention.

FIG. 3 schematically depicts a spectral purity filter SPF according to a first embodiment of the present invention. The spectral purity filter SPF includes a plate 50 in which a periodic array of circular apertures 52 is provided. The diameter D of the apertures 52 is selected such that a first wavelength of radiation to be suppressed is substantially diffracted at the entrance of each aperture 52, while radiation of a second, shorter wavelength is transmitted through the apertures 52. The diameter of the apertures 52 is greater than 20 μm. A diameter slightly greater than 20 μm is particularly suited to the diffraction and suppression of 10.6 μm infrared radiation, which is often generated by the radiation sources of EUV lithographic apparatus. The apertures 52 may have a diameter which is greater than 20 µm and less than or equal to 200 µm, in order to suppress by diffraction longer wavelengths of infrared radiation.

The plate 50 can be formed from any suitable material. The plate 50 should be substantially opaque to the first wavelength or range of wavelengths which the spectral purity filter SPF is designed to suppress. For instance, the plate 50 may reflect or absorb the first wavelength, for example a wavelength in the infrared range of the electromagnetic spectrum. The plate 50 may also be substantially opaque to one or more second wavelengths of radiation which the spectral purity filter SPF is designed to transmit, for example a wavelength in EUV range of the electromagnetic spectrum. However, the spectral purity filter SPF can also be formed from a plate 50 which is substantially transparent to the one or more wavelengths which the spectral purity filter SPF is designed to transmit. This may increase the transmittance of the spectral purity filter with respect to the one or more wavelengths which the spectral purity filter SPF is designed to transmit. An example of a material which may form the plate 50 of a spectral purity filter SPF is a metal. Another example is a thin foil that is substantially transparent to EUV radiation.

The apertures 52 in the spectral purity filter SPF are arranged in a hexagonal pattern. This embodiment gives the closest packing of circular apertures, and therefore the highest transmittance for the spectral purity filter. However, other arrangements of the apertures are also possible, for example square, and rectangular or other periodic or aperiodic arrangements may be used. For instance, in the case of an aperiodic array, a random pattern may be employed.

FIG. 4 is a schematic depiction of a spectral purity filter SPF in accordance with another embodiment of the present invention. In this embodiment, it can be seen that apertures 54 are provided in the spectral purity filter SPF. The apertures 54 are not circular, but are instead elongated slots or slits. It can be seen that a shorter dimension SD of the aperture 54 has a length of between greater than 20 µm and less than or equal to 200 µm. A longer dimension LD of the apertures 54 may be any length. It will be appreciated that the elongated apertures 54 shown in FIG. 4 are only suitable for situations where the radiation which is incident upon them, and which it is desired to diffract, is substantially polarized in a direction substantially parallel to the longer dimension LD.

Figure 5:
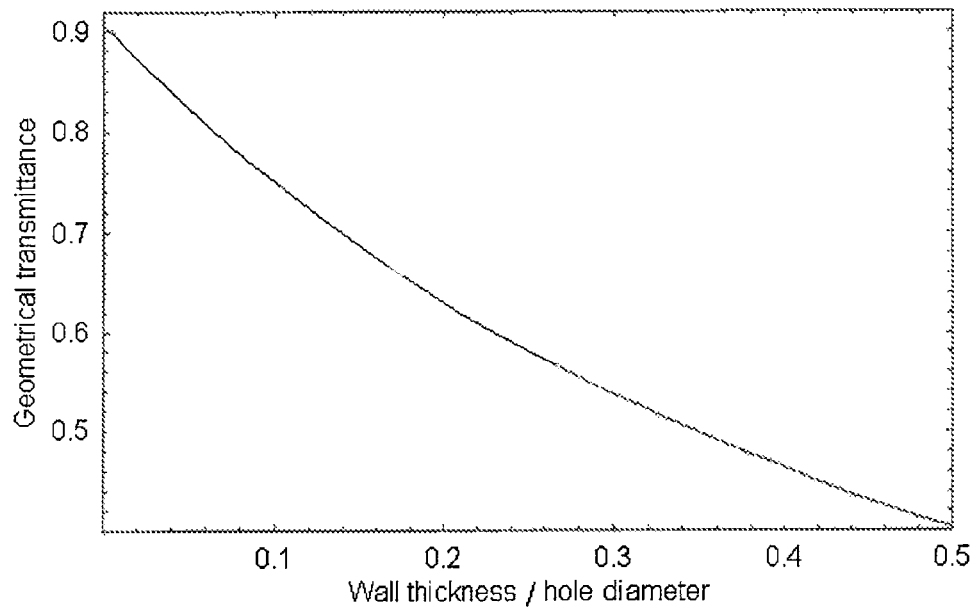
FIG. 5 is a graph schematically depicting operating principles associated with the embodiments shown in FIGS. 3 and 4.

FIG. 5 is a graph depicting the geometrical transmittance of the spectral purity filter of FIG. 3, and how this varies as a function of the ratio of the wall thickness between apertures to the diameter of those apertures (or, in other words, holes in the spectral purity filter). The geometrical transmittance is proportional to the area which the apertures in total define when the spectral purity filter is viewed end-on, as shown in FIG. 3. It can be seen from FIG. 5 that for a typical wall thickness of one-tenth of the aperture diameter, the geometrical transmittance of the spectral purity filter is about 75%. It can be seen that the geometrical transmittance can be further increased by increasing the diameter of the apertures, although this will probably lead to a less robust spectral purity filter due to a reduction in the wall thickness between apertures.

The minimum thickness of the spectral purity filter will depend on whether it is desired to absorb the diffracted radiation in the sidewalls of the apertures of the spectral purity filter, or whether it is desired to absorb the diffracted radiation downstream of the spectral purity filter. When the spectral purity filter is sufficiently thick, most of the diffracted radiation may be absorbed in the sidewalls of the apertures. Since only a small fraction of the incident power (of the radiation beam) reaches the exit of the apertures, the effect of interference between different apertures may be neglected. Consequently, the suppression of infrared radiation is approximately equal to that of a single aperture of the same dimensions.

In the Fraunhofer (far field) approximation of diffraction from a single circular aperture, the intensity distribution as a function of the diffraction angle θ is given by:

$$I(\theta) = I_0 \left( \frac{2J_1(ka\sin\theta)}{ka\sin\theta} \right)^2$$

where $k=2\pi/\lambda$ is the wavenumber, a is the aperture radius and $J_1$ is the first-order Bessel function of the first kind.

It is desirable to suppress the transmission of infrared radiation, as discussed above. Depending on the application in question, it may be desirable to suppress the infrared radiation by a factor of 100 or more, or in other applications by a factor of around 10. In some applications, a suppression factor of 20 may be desirable. This means that only 5% of the infrared radiation incident on the spectral purity filter will be transmitted by the spectral purity filter.

Figure 6:
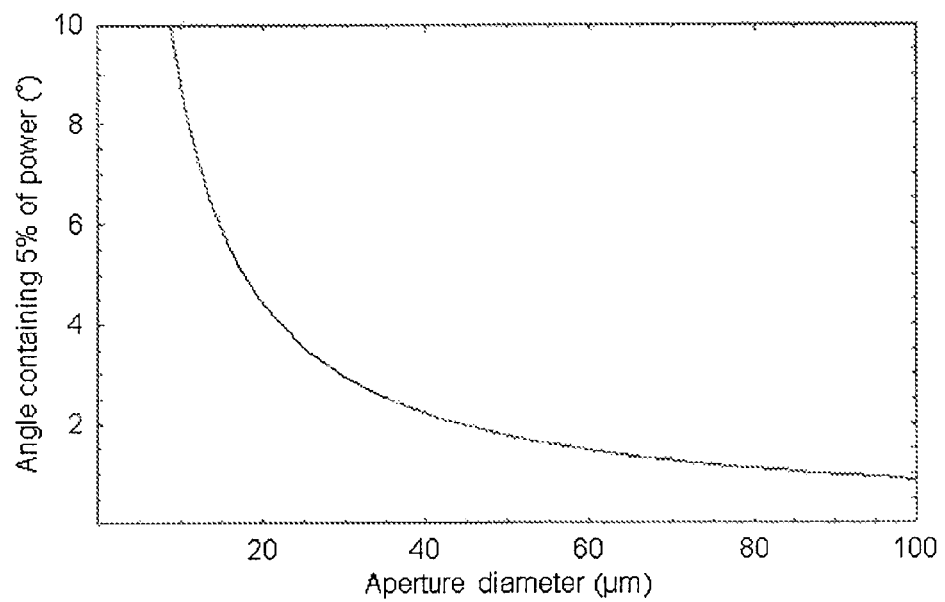
FIG. 6 is a graph schematically depicting further operating principles associated with the embodiments shown in and described with reference to FIGS. 3 and 4.

FIG. 6 shows the angle within which 5% of the infrared radiation (in terms of power, or in other words intensity) is contained as a function of the aperture diameter (where the aperture diameter is twice the aperture radius, i.e., 2a). FIG. 6 shows that if apertures having a diameter of 30 µm are used, the angle containing 5% of the transmitted radiation will be 2.9°. In order to achieve the desired suppression factor of 20 (in other words, to achieve a transmission of 5% of the incident infrared radiation), all radiation diffracted by more than 2.9° must be absorbed. Such absorption can take place within the spectral purity filter. The minimum thickness of the spectral purity filter is then determined by the aperture diameter and the minimum diffraction angle outside which all radiation is to be absorbed. For example, with the 30 µm diameter apertures described above, the angle containing 5% of the transmitted radiation was described as being 2.9°. Therefore, in order to ensure that all radiation outside of this diffraction angle is absorbed by the sidewalls of the apertures, the spectral purity filter must have a minimum thickness of:

$$30 \text{ µm/tan } 2.9° = 0.584 \text{ mm}$$

More infrared radiation having a wavelength of 10.6 µm can be suppressed by increasing the thickness of the spectral purity filter. However, the transmittance of radiation having a shorter wavelength (e.g., EUV radiation) will be reduced due to the higher aspect ratio of the apertures.

For a thinner spectral purity filter, a substantial fraction of the incident power is transmitted through the spectral purity filter. The degree of interference between the radiation transmitted through the apertures depends on the coherence of the radiation. For example, when the incoming radiation is very incoherent, there is no substantial interference between the apertures and the diffraction pattern is described by the single-aperture approximation described above. In this case, it is possible to absorb the infrared radiation at a location behind (i.e., downstream of) the spectral purity filter. For example, if the spectral purity filter is located 0.5 m before an intermediate focus of the lithographic apparatus (for example, the virtual source point 18 shown in and described with reference to FIG. 2), the diffracted radiation can be absorbed by a plate or the like located at the intermediate focus. The plate is provided with an aperture having a diameter of 8 mm for transmitting, for example, EUV radiation. In this case, all radiation diffracted by 0.9° is prevented from passing through the aperture. From FIG. 6, it can be seen that the apertures in the spectral purity filter can have a diameter as large as 100 μm in order to ensure that the angle containing 5% of the transmitted radiation is 0.9° (or in other words to ensure that the suppression factor is approximately 20). Since the spectral purity filter in this embodiment would only act to diffract the radiation, and not to absorb it, the spectral purity filter may be as thin as minimally required for mechanical stability and may be, for example, 0.1 mm thick.

In FIGS. 3 and 4, the apertures of the spectral purity filters have been shown and described as being part of a periodic array of apertures. A coherent source of infrared radiation incident upon the spectral purity filter combined with a periodic aperture array could give rise to a far field diffraction pattern with a very sharp (e.g., less than 0.5°) central maximum, in which 80-90% of the infrared radiation intensity is contained. If a transmission profile having such a far field diffraction pattern were to be established, it would be difficult or impossible to separate the infrared radiation from the EUV radiation in the far field. Therefore, in the case of a substantially coherent source of radiation, other methods of affecting the diffraction pattern may be used. For example, an aperiodic array of apertures will ensure that the central maximum of the resultant diffraction pattern is broadened, and is not very sharp. This would make it easier to separate the infrared radiation from the EUV radiation in the far field, for example using a plate provided with an aperture as described above.

FIG. 7 schematically depicts and summarizes the embodiments shown in and described with reference to FIGS. 3 to 6. A radiation beam 60 including EUV radiation 62 and infrared radiation 64 is incident upon a spectral purity filter SPF as described above in relation to, for example, FIG. 3. Downstream of the spectral purity filter SPF is located a plate 66 which is capable of absorbing infrared radiation 64. The plate 66 is provided with an aperture 70, and is located adjacent to an intermediate focus 68 of the radiation beam 60 such that the intermediate focus 68 is located in the aperture 70. When the radiation beam 60 is incident upon the spectral purity filter SPF, the EUV part of the radiation beam 62 passes through the spectral purity filter SPF without being diffracted. At the same time, the infrared part of the radiation beam 64 is diffracted by apertures of the spectral purity filter SPF, as described above. Thus, at the location of the plate 66, it can be seen that the EUV part of the radiation beam 62 passes through the aperture 70, whereas a majority of the diffracted infrared part of the radiation beam 64 is instead directed toward and absorbed by the plate 66. Downstream of the plate 66, it will be appreciated that the infrared part 64 of the radiation beam has been reduced or substantially eliminated, leaving a radiation beam 72 which includes substantially EUV radiation.

In the above embodiments, the apertures have been described as being circular or slot or slit-like. The apertures can be other shapes, such as for example rectangular, hexagonal, pentagonal, etc.

The spectral purity filter described above has been described as being formed from a plate. The spectral purity filters described herein can instead be formed from a mesh, or two overlapping perpendicular wire grids. It may be easier to manufacture a mesh than it is to drill holes in a plate. Wire grids may also be easier to manufacture than an array of circular apertures in a plate. For instance, each of the wire grids can be formed, for example, using laser interference lithography. This may be quicker and easier to undertake than providing a spectral purity filter with an array of drilled apertures, where each aperture may need to be individually drilled using a laser machine tool.

In the above embodiments, absorption in the sidewalls of apertures of the spectral purity filter has been described. The spectral purity filter may be formed from a material which is suitable for absorption of one or more wavelengths of radiation. For example, the spectral purity filter may be formed from a material with a high infrared radiation absorptivity. For instance, many glasses (e.g., fused silica) and ceramics (e.g., $TiO_2$) fall within this category. As mentioned above, the use of apertures having diameters greater than 20 nm makes it easier to apply a coating to sidewalls of the apertures. This means that the sidewalls of the apertures may be provided with a coating which is or includes a material which absorbs or inhibits reflection of certain wavelengths of radiation. For example, in the case of the absorption of infrared radiation, coatings may be provided which are formed from or include materials such as the glasses or ceramics mentioned above. Alternatively or additionally, an anti-reflection coating may be applied to the sidewalls of the apertures, including for example $CO_2$ laser window materials, such as ZnSe, ZnS, GaAs and Ge, and/or low refractive index halides such as $ThF_4$ and $YF_3$. The coating may additionally or alternatively promote the reflection of one or more wavelengths of radiation, such as for example EUV radiation.

FIG. 8 shows an embodiment of a spectral purity filter. In this embodiment, a coating (as described above) has been applied to sidewalls of the apertures of the spectral purity filter. FIG. 8 shows a spectral purity filter SPF in section view. Apertures 80 are shown as being provided in a plate 81 of the spectral purity filter SPF. Sidewalls of the apertures 80 have been provided with an infrared radiation absorbing material 82.

EUV radiation 84 and infrared radiation 86 are shown as being incident upon the spectral purity filter SPF and apertures 80 of the spectral purity filter SPF. The infrared radiation 86 is diffracted as it enters the apertures 80, and is absorbed by the coating 82 on the side walls of the apertures 80. It can be seen that radiation transmitted by the spectral purity filter SPF includes mainly EUV radiation 84.

The coating 82 provided on the sidewalls of the apertures 80 does not need to promote or suppress reflection of one or more wavelengths of radiation. The coating 82 can instead be used to prevent the apertures 80 from degradation or environmental damage.

The spectral purity filters of above embodiments have been described as being formed from plates (or the like) that are substantially opaque to an undesired wavelength of radiation, for example infrared radiation. The spectral purity filters described above are provided with apertures which diffract the undesired wavelength of radiation, while allowing a desired wavelength of radiation to be transmitted by the apertures. Thus, the spectral purity filters described above will reflect or absorb undesired wavelengths of radiation, either in the side walls of the apertures or in or from parts of the spectral purity filters upon which the undesired wavelength is incident (for example, parts of the spectral purity filter that do not define apertures). Absorption of the undesired wavelength can cause the spectral purity filter to heat up. Such heating can result in damage to the spectral purity filter and/or distortion of the spectral purity filter. Such distortion or damage may detrimentally affect the functionality of the spectral purity filter.

For the reasons given above, in some applications it may therefore be desirable to reduce the heat load on a spectral purity filter. According to an embodiment of the present invention, this may be achieved by the use of a spectral purity filter that acts as a phase grating for the undesired wavelength or wavelengths of radiation. The phase grating spectral purity filter includes a material that is substantially transparent (and, ideally, fully transparent) to the undesired radiation. Furthermore, the phase grating spectral purity filter is provided with apertures which are constructed (e.g., have a spacing or diameter which is) such that most of the undesired radiation is diffracted into diffraction orders other than the zero order. One advantage of this solution is that the undesired radiation is not absorbed by the special purity filter, and does therefore not heat the spectral purity filter. Another advantage is that, since most of the undesired radiation is not diffracted into the zero order, a structure provided with an aperture placed at a location aligned with the zero order will allow desired (and not diffracted) radiation to pass through the aperture, while the undesired radiation is blocked by material (e.g., a plate) surrounding the aperture. In the case of an aperiodic array of apertures, there may not be any 'orders' as such. Therefore, according to a more general embodiment of the present invention, the spacing or diameter of the one or more apertures of the spectral purity filter may be configured to ensure that less than 50% of radiation of a first wavelength of radiation (e.g., infrared radiation) is able to pass through the further aperture that is provided in the structure. The spacing or diameter of the one or more apertures of the spectral purity filter may be configured to ensure that less than 10% of radiation of a first wavelength of radiation (e.g., infrared radiation) is able to pass through the further aperture that is provided in the structure. The spacing or diameter of the one or more apertures of the spectral purity filter may be configured to ensure that less than 5% of radiation of a first wavelength of radiation (e.g., infrared radiation) is able to pass through the further aperture that is provided in the structure FIG. 9 schematically depicts a phase grating spectral purity filter PGSPF in accordance with an embodiment of the present invention. The phase grating spectral purity filter PGSPF includes a plate 90 that is substantially transparent to an undesired (e.g., 'first') wavelength of radiation. For instance, if the undesired radiation includes 10.6 μm radiation, the plate 90 may be formed from silicon, ZnSe, ZnS, GaAs, Ge, diamond or diamond-like carbon.

The plate 90 is provided with an array of apertures 92. The aperture diameter AD is chosen such that the undesired wavelength of radiation diffracts when it is incident upon the aperture 92. For instance, the apertures 92 may conveniently be greater than 20 μm in diameter, for ease of manufacturing as described above. The array of apertures 92 have a periodicity PE which is chosen such that the first diffraction order of the diffracted undesired wavelength of radiation is substantially separated from the zero diffraction order. The significance of this arrangement will be described in more detail below. Typically, the periodicity PE is of the same order of magnitude as the wavelength of radiation that the phase grating spectral purity filter PGSPF is designed to diffract. However, in other embodiments, the periodicity PE may be up to two orders of magnitude larger than this wavelength (for example, if only a very small degree of diffraction of the undesired wavelength of radiation is required).

So far FIG. 9 has been described in relation to the diffraction of an undesired wavelength of radiation as a consequence of the incorporation of the apertures 92. As mentioned above, this spectral purity filter is a phase grating spectral purity filter PGSPF. The significance of the "phase grating" prefix will now be described.

FIG. 10 shows the phase grating spectral purity filter PGSPF in section view. FIG. 10 illustrates the apertures 92 and the material forming the plate 90 surrounding these apertures 92. Undesired radiation 94 (e.g., infrared radiation) is shown as being incident upon the phase grating spectral purity filter PGSPF. The phase grating spectral purity filter PGSPF has a thickness H which is chosen such that the phase difference between the radiation passing through the plate 96 and the radiation passing through the apertures is π radians. In other words, radiation emerging from the apertures 98 is 180° out of phase with radiation emerging from the plate 96. If it is assumed that the diameter of the apertures is substantially larger than the wavelength of undesired radiation, diffraction effects can be assumed to be small and therefore the phase shift can be calculated based on a plane wave front.

The phase difference $\Delta\phi$ between radiation passing through the plate and radiation passing through the apertures is thus given by:

$$\Delta\varphi = \frac{2\pi H(n_1 - n_0)}{\lambda}$$

where $n_1$ is the refractive index of the material of the plate and $n_0 = 1$ is the refractive index of vacuum.

Thus, the thickness that gives a phase difference of π is given by:

$$H = \left(m + \frac{1}{2}\right)\frac{\lambda}{n_1 - n_0}$$

where m=0, 1, 2, . . . is a non-negative integer.

When silicon is chosen to form the material or the plates 90, the thickness H (in μm) that gives a phase difference of π is given by:

$$H = (2.19 + m\ 4.38)\ \mu m.$$

As is known in the art, when the thickness of the phase grating spectral purity filter is such that the phase difference between radiation passing through the plate and radiation passing through the apertures is π radians, destructive interference of the undesired wavelength of radiation will take place.

FIGS. 11 and 12 depict the effects of the phase grating spectral purity filter of FIGS. 9 and 10 on an incoming beam of radiation including an undesired wavelength of radiation. An undesired wavelength of radiation 94 is shown as being incident upon the phase grating spectral purity filter PGSPF. The diameter and periodicity of apertures of the phase grating spectral purity filter PGSPF are chosen such that the undesired wavelength of radiation is diffracted, and diffracted such that a first diffraction order 100 is substantially separated from a zero diffraction order 102. FIG. 11 does not, however, represent the effects on the zero order 102 of the destructive interference mentioned above.

FIG. 12 more accurately represents the cumulative effects of the separation of the first diffraction order 100 from the zero diffraction order 102, and the effects on the zero diffraction of the destructive interference mentioned above. The zero diffraction order 102 contains only a small fraction of the incident intensity of the undesired wavelength of radiation 94 (typically less than 10%). Most of the undesired radiation is diffracted into higher orders, such as the first order and higher orders. To ensure that most of the incident intensity of the undesired wavelength of radiation 94 is diffracted into higher diffraction orders, the fill factor of the phase grating spectral purity filter PGSPF should have a fill factor of the order of 50% or greater (the fill factor being defined as the fractional area occupied by the material forming the plate, and not the spaces left by the apertures).

A plate 104 may be provided to absorb the first and higher diffraction orders. An aperture 106 is provided in the plate 104 to allow, for example, undiffracted radiation to pass through (for example EUV radiation). It can be seen that the zero diffraction order 102 is also able to pass through the aperture, although this order (as described above) will typically be less than 10% of incident intensity. The phase grating spectral purity filter PGSPF and the plate 104 and aperture 106 therefore prevent at least 90% of the undesired radiation from passing any further, for example into or through a part of a lithographic apparatus.

Because the fill factor is 50%, this means that the transmittance of radiation which is blocked by the plate (for instance, EUV radiation) is also of the order of 50%. The transmittance of radiation not blocked by the plate can be increased by reducing the fill factor, but this results in a reduced suppression of the undesired radiation (for example, infrared radiation).

FIG. 13 shows the increase in infrared radiation transmittance of the phase grating spectral purity filter described above for an EUV transmittance increase from 50% to 100% (which corresponds to the fill factor being reduced from 50% to 0%). The graph represents a relationship for a one-dimensional phase grating, for instance a grating including a single row or column of apertures. It can be seen that, for example, at an EUV transmittance of 60%, the infrared transmittance is 4%, and thus the relative suppression factor of infrared radiation is 15 (i.e., the filter decreases the ratio of infrared radiation to EUV radiation by a factor of 15).

FIG. 14 schematically summarizes the principles discussed in relation to FIGS. 9 to 13. A beam of radiation including an EUV component 108 and an infrared component 110 is incident upon a phase grating spectral purity filter PGSPF as described above. The phase grating spectral purity filter PGSPF is shown in relation to a plate 112 provided with an aperture 114. It can be seen that the EUV component 108 passes through apertures (not shown in the Figure) of the phase grating spectral purity filter PGSPF and towards and through the aperture 114 in the plate 112. In contrast, the infrared component 110 is destructively interfered with, as well as being and diffracted by the phase grating spectral purity filter PGSPF. The result is that the first diffraction order of the infrared component 110 is separated from the zero order to such an extent that the first and higher diffraction orders may be blocked by the plate 112, and prevented, for example, from passing on to and through a lithographic apparatus. The zero diffraction order is substantially reduced or eliminated.

FIG. 15 schematically depicts an embodiment. The phase grating spectral purity filter PGSPF as described above is placed in front of (i.e., up-stream of) an intermediate focus 120 of a lithographic apparatus, for example the virtual source point 18 shown in and described with reference to FIG. 2. Referring back to FIG. 15, the intermediate focus 120 is located within an aperture 122 of a plate 124. The plate may, for example, form part of a source or illuminator housing. A radiation beam 126 incident upon the phase grating spectral purity filter PGSPF includes an EUV component 128 and an infrared component 130. As described above, the phase grating spectral purity filter PGSPF is configured to diffract and cause destructive interference of the infrared component 130 such that the majority of the infrared component 130 is either destructively interfered with, or diffracted to such an extent that is not able to pass through the aperture 122. For instance, it can be seen that the first and higher diffraction orders 132 of the infrared component 130 are diffracted such that they are unable to pass through the aperture 122. A small percentage of the zero diffraction order 134 of the infrared component 130 is able to pass through the aperture 122. However, this small percentage of the zero diffraction order 134 will be only a fraction of the infrared component 130, and maybe for example, less than 10% of the incident intensity.

A typical diameter of the aperture 122 at the intermediate focus 120 (for example, the entrance pupil of an illuminator) is 8 mm. Thus, if the distance from the phase grating spectral purity filter PGSPF to the intermediate focus 120 is 0.1 m, diffraction orders separated by more than 2.3° (arctan (0.004/0.1)) from the zero order are suppressed. For the first diffraction order (and therefore higher diffraction orders) to be diffracted by more than 2.3°, the periodicity of the apertures of the phase grating spectral purity filter PGSPF referred to above should be less than 264 µm (calculated using $\lambda/\sin\theta = 264$ µm, where $\lambda = 10.6$ µm and $\theta = 2.3°$).

In the embodiments described above in relation to FIGS. 9 to 15, up to 50% of the EUV radiation is blocked by the material which forms the plate of the phase grating spectral purity filter. It is desirable to increase the EUV transmittance whilst still suppressing the infrared radiation by destructive interference and diffraction. In accordance with a further embodiment of the present invention, material which forms the phase grating spectral purity filter contains a first array of apertures, and a second array of apertures, the second array of apertures being distributed around the first array of apertures and having diameters which are less than those of the first array. The first array of apertures have a diameter sufficient to cause diffraction of radiation which is to be suppressed (e.g., infrared radiation). The second (or further) array of apertures have a diameter which is less than the wavelength of the radiation which it is desired to suppress. This means that the second array of apertures (which may be referred to as sub-wavelength apertures) do not affect the diffraction of the radiation which it is desired to suppress, but will allow more shorter wavelength (for example EUV) radiation to pass through the phase grating spectral purity filter.

For the purposes of determining phase differences for the radiation that passes through the apertures and the material of the phase grating spectral purity filter PGSPF, etc., the refractive index of the material with the sub-wavelength apertures may be approximated by a so-called effective medium approximation, for example, based on a weighted average of the dielectric constants of the material and vacuum (if the phase grating spectral purity filter is used in a vacuum). Therefore, in order to take into account the incorporation of the sub-wavelength apertures, the thickness of the phase grating spectral purity filter must be changed accordingly so as to still obtain the desired phase shift and subsequent destructive interference of the undesired radiation which passes through the larger apertures and through the material forming the phase grating spectral purity filter.

FIG. 16 illustrates an embodiment of a phase grating spectral purity filter which is provided with sub-wavelength apertures. FIG. 16 schematically depicts a phase grating spectral purity filter PGSPF. Material 144 forming the phase grating spectral purity filter PGSPF is provided with a first array of apertures 140. The first array of apertures is arranged (e.g., have a diameter which is sufficient) to cause slight diffraction of a first wavelength of radiation, for example an undesired wavelength of radiation such as, for example, infrared radiation. The first array of apertures is also arranged (e.g., have a diameter which is sufficient) to allow transmission of a second wavelength of radiation, for example a desired wavelength of radiation such as, for example, EUV radiation. The second wavelength of radiation has a shorter wavelength that that of the first wavelength of radiation.

A second (or in other words further) array of apertures 142 is also provided in material 144 forming the phase grating spectral purity filter PGSPF. The second array of apertures 142 have a diameter which is less than the diameter of the apertures 140 forming the first array. The diameter of the apertures of the second array 142 is less than the first wavelength of radiation of which the phase grating spectral purity filter is arranged to diffract and cause destructive interference. Preferably the diameter of the apertures of the second array 142 is less than half of the wavelength of the first wavelength of radiation, in order to ensure the validity of an effective medium approximation as described above. The diameter of the apertures of the second array 142 is greater than the second wavelength of radiation which the phase grating spectral purity filter is arranged to transmit. This means that the diffraction of the first wavelength of radiation (e.g., infrared radiation) is not affected, while the transmission of the second wavelength of radiation (e.g., EUV radiation) is increased by provision of the further array of apertures.

A silicon phase grating spectral purity filter according to this embodiment of the present invention could include a two dimensional array of larger apertures with a diameter of 100 μm and a fill factor of 50%. The material (i.e., silicon) between the large apertures could be provided with a further array of smaller diameter apertures with a diameter of 4 μm and, for example, a fill factor of 50%. The effective refractive index of the material between the large apertures is calculated according to a weighted average of the dielectric constant (which is approximately equal to the square of the refractive index) resulting in a value of $\sqrt{(0.5 \times 3.42^2 + 0.5 \times 1^2)} = 2.52$. Consequently, in order to achieve a phase shift of π of the first wavelength of radiation as it passes through the phase grating spectral purity filter PGSPF (to achieve destructive interference), the calculation that needs to be performed to determine the thickness of the phase grating spectral purity filter PGSPF will need to be modified to take into account this effective refractive index. The thickness of the silicon phase grating spectral purity filter PGSPF should therefore be calculated using:

$$H = (3.49 + m\ 6.98)\ \mu m$$

where m is a positive integer or zero. For example, H may be 6.98 μm. It will be appreciated that this calculation will be different if a material having a refractive index different than that of silicon is used to form the phase grating spectral purity filter PGSPF.

In this phase grating spectral purity filter, the infrared transmittance is close to zero (see for example the graph of FIG. 13). With an overall fill factor of 25%, the EUV transmittance of the phase grating spectral purity filter is approximately 75%.

It will be appreciated that the use of sub-wavelength (with respect to a wavelength to be diffracted by larger apertures of the spectral purity filter) apertures is not restricted to use in phase grating spectral purity filters. Such sub-wavelength apertures may be provided in any spectral purity filter in order to increase the transmission of the spectral purity filter to one or more wavelengths of radiation.

In the above described embodiments, a 'desired' wavelength of radiation has been described as being a wavelength of radiation in or below the EUV range of the electromagnetic spectrum. Furthermore, an 'undesired' wavelength has been described as a wavelength of radiation in the infrared part of the electromagnetic spectrum. It will be appreciated that the present invention is also applicable to other wavelengths of radiation. For example, the embodiments described above in relation to FIGS. 9 to 15 (where the first diffraction order is separated from the zero order such that the first order does not pass through an aperture provided downstream of the spectral purity filter) may also be applicable to wavelengths of radiation other than EUV radiation and infrared radiation. Similarly, the embodiments described above in relation to FIG. 16 (where sub-wavelength apertures are used to improve the transmittance of a phase grating spectral purity filter to a desired wavelength of radiation) may be used in conjunction with wavelengths of radiation other than EUV radiation.

Although the above description of embodiments of the invention relates to a radiation source which generates EUV radiation (e.g., 5-20 nm), the invention may also be embodied in a radiation source which generates 'beyond EUV' radiation, that is radiation with a wavelength of less than 10 nm. "Beyond EUV" radiation may for example have a wavelength of 6.7 nm or 6.8 nm. A radiation source which generates "beyond EUV" radiation may operate in the same manner as the radiation sources described above. The invention is also applicable to lithographic apparatus that uses any wavelength of radiation where it is desired to separate, extract, filter, etc. one or more wavelengths of radiation from another one or more wavelengths of radiation. The described spectral purity filter may be used, for example, in a lithographic apparatus or a radiation source (which may be for a lithographic apparatus). The invention may also be applied to fields and apparatus used in fields other than lithography.

The description above is intended to be illustrative, not limiting. Thus, it will be apparent to one skilled in the art that modifications may be made to the invention as described without departing from the scope of the claims set out below.

What is claimed is:

1. A spectral purity filter, comprising:
a base having a thickness defined by two opposing major surfaces with a first array of apertures formed therein, the first array of apertures extending through the thickness of the base and defining a sidewall within each aperture; and
a coating provided on the sidewalls of the first array of apertures, wherein the first array of apertures are configured to diffract a first wavelength of radiation and to allow at least a portion of a second wavelength of radiation to be transmitted, the second wavelength of radiation being shorter than the first wavelength of radiation, wherein the base further comprises a second array of apertures, each aperture of the second array of apertures having a diameter less than the first wavelength.

2. The spectral purity filter of claim 1, wherein the coating is arranged to absorb at least a portion of the first wavelength of radiation.

3. The spectral purity filter of claim 1, wherein the coating is arranged to inhibit reflection of at least a portion of the first wavelength of radiation.

4. The spectral purity filter of claim 1, wherein the coating is arranged to promote reflection of at least a portion of the second wavelength.

5. The spectral purity filter of claim 1, wherein the coating is arranged to inhibit degradation or environmental damage to the first array of apertures.

6. The spectral purity filter of claim 1, wherein the first array of apertures each have a diameter greater than 20 μm.

7. The spectral purity filter of claim 1, wherein the diameter is less than half of the first wavelength.

8. The spectral purity filter of claim 7, wherein the diameter is greater than the second wavelength.

9. The spectral purity filter of claim 1, wherein the first array of apertures have a periodicity such that the first diffraction order of the first wavelength of radiation is substantially separated from the zero diffraction order.

10. The spectral purity filter of claim 1, wherein the base comprises at least one of a plate, a mesh, and a wire grid.

11. The spectral purity filter of claim 1, wherein the first array of apertures or the second array of apertures are circular apertures arranged in a periodic array.

12. The spectral purity filter of claim 11, wherein the periodic array comprises a hexagonal pattern array.

13. The spectral purity filter of claim 1, wherein the first array of apertures are elongated slots arranged in a linear array.

\* \* \* \* \*